United States Patent
Lyoo et al.

(10) Patent No.: US 7,994,084 B2
(45) Date of Patent: Aug. 9, 2011

(54) DIELECTRIC COMPOSITION AND MULTILAYER CERAMIC CAPACITOR EMBEDDED LOW TEMPERATURE CO-FIRED CERAMIC SUBSTRATE USING THE SAME

(75) Inventors: Soo Hyun Lyoo, Gyunggi-do (KR); Jong Myeon Lee, Gyunggi-do (KR); Ho Sung Choo, Gyunggi-do (KR); Min Ji Ko, Gyunggi-do (KR); Beom Joon Cho, Gyunggi-do (KR); Myung Whun Chang, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 358 days.

(21) Appl. No.: 12/323,840

(22) Filed: Nov. 26, 2008

(65) Prior Publication Data

US 2009/0141427 A1    Jun. 4, 2009

(30) Foreign Application Priority Data

Nov. 29, 2007 (KR) .................. 10-2007-0122993

(51) Int. Cl.
*C04B 35/468* (2006.01)
*H01G 4/12* (2006.01)
(52) U.S. Cl. .................. 501/139; 361/321.4
(58) Field of Classification Search .............. 501/139; 361/321.4
See application file for complete search history.

(56) References Cited

U.S. PATENT DOCUMENTS 7,781,360 B2 * 8/2010 Hasegawa et al. ............ 501/138

FOREIGN PATENT DOCUMENTS

| JP | 2005-231962 | 9/2005 |
|---|---|---|
| JP | 2006-093484 | 4/2006 |
| JP | 2007-290940 | 11/2007 |
| JP | 2008254935 | * 10/2008 |
| KR | 10-2005-0091961 A | 9/2005 |
| WO | WO 2005/085154 A1 | 9/2005 |

OTHER PUBLICATIONS

Hasegawa et al "Dielectric Properties and Microstructures of Low-Temperature-Sintered BaTiO3-Based Ceramics with CuBi2O4 Sintering Aid", Japanese Journal of Applied Physics, vol. 45, No. 9B, Sep. 2006, pp. 7360-7364.*
Japanese Office Action, w/ English translation thereof, issued in Japanese Patent Application Office Action issued in Japanese Patent Application No. JP 2008-304509 dated Apr. 26, 2011.

* cited by examiner

*Primary Examiner* — Karl E Group
(74) *Attorney, Agent, or Firm* — McDermott Will & Emery LLP

(57) ABSTRACT

Provided are a dielectric composition and a multi-layer ceramic capacitor embedded low temperature co-fired ceramic substrate using the same. The dielectric composition includes a main component, $BaTiO_3$ of about 80 wt % or more, and an accessory component, $CuBi_2O_4$ and $ZnO$—$B_2O_3$—$SiO_2$-based glass of about 20 wt % or less.

12 Claims, 2 Drawing Sheets

DIELECTRIC COMPOSITION AND MULTILAYER CERAMIC CAPACITOR EMBEDDED LOW TEMPERATURE CO-FIRED CERAMIC SUBSTRATE USING THE SAME

CROSS-REFERENCE TO RELATED APPLICATIONS

This application claims the priority of Korean Patent Application No. 2007-0122993 filed on Nov. 29, 2007, in the Korean Intellectual Property Office, the disclosure of which is incorporated herein by reference.

BACKGROUND OF THE INVENTION

1. Field of the Invention

The present invention relates to a dielectric composition and a multi-layer ceramic capacitor embedded low temperature co-fired ceramic substrate using the same, and more particularly, to a dielectric composition and a multi-layer ceramic capacitor embedded low temperature co-fired ceramic substrate using the same, which is sinterable at a low temperature while showing a high dielectric constant.

2. Description of the Related Art

Recently, a technology of reducing a total volume of a product and increasing the degree of integration of a substrate not by mounting a device such as a surface mount device on the surface of the substrate but by embedding the device into a substrate having a circuit pattern is receiving attention according to the miniaturization and high frequency tendency of various electrical products.

When a chip-typed device on the substrate is replaced with a layer-typed device (e.g., a capacitor), an increase of the volume caused by the chip may be suppressed. Also, the layer-typed capacitor has more excellent high-frequency property (e.g., smaller parasitic inductance) than the chip-typed capacitor. Accordingly, various attempts have been made to embed the chip into the substrate.

A Printed Circuit Board (PCB) is generally divided into two types according to materials forming a dielectric layer. One PCB applied with a polymeric organic material as a dielectric layer is more widely used. A plating method is used to form a circuit pattern on the PCB. On the other hand, a screen printing is mainly used to form the circuit pattern on the other PCB, the dielectric layer of which is formed of a ceramic material. In this case, the PCB is manufactured by sintering the dielectric layer and an electrode simultaneously. The sintering process is generally performed at a temperature of about 800° C. or more.

Two types of substrates have very different properties in the aspects of a material and a manufacturing process. However, their structures are very similar to each other in that the circuit pattern is formed in a laminated body of multilayer. Accordingly, their applicable ranges overlap each other in many cases. There are few technologies to which both types of substrates may be together applied because the material and the manufacturing process of each type is entirely different from each other as described above.

In a case where the capacitor is embedded into the ceramic substrate, a dielectric layer for a capacitor and an internal electrode are formed and simultaneously sintered between ceramic green sheets including a ceramic and a glass. In case of the capacitor, the dielectric constant property is important. $BaTiO_3$ may be used as a main component of composition used in the dielectric layer instead of Pb because of a high dielectric constant and environmental reason. However, $BaTiO_3$ may be sintered at a temperature of about 1400° C. or more unless a sintering additive is used. Moreover, although the sintering additive is used, $BaTiO_3$ is difficult to be sintered at a temperature of about 1000° C. or less.

In a ceramic substrate embedded with the capacitor, the dielectric constant and the sinterable temperature are important. In case of the ceramic substrate, an electrode is formed by printing a metal such as Ag or Cu, which is sintered to form a circuit pattern on the substrate. Accordingly, the firing temperature of the ceramic substrate must be lower than at least the melting points of Ag and Cu. However, when the capacitor is embedded, the firing temperature of the capacitor must be lower than at least the melting points of Ag and Cu because the embedded capacitor must be together sintered. In this case, as described above, the dielectric layer may not be completely sintered. Moreover, the dielectric constant may be reduced.

Accordingly, the development of a technology capable of manufacturing a low temperature co-fired ceramic substrate embedded with a multi-layer ceramic capacitor showing a high dielectric constant after even a low temperature firing is required.

SUMMARY OF THE INVENTION

An aspect of the present invention provides to a dielectric composition and a multi-layer ceramic capacitor embedded low temperature co-fired ceramic substrate using the same, which is sinterable at a low temperature while showing a high dielectric constant.

According to an aspect of the present invention, there is provided a dielectric composition including: a main component, $BaTiO_3$ of about 80 wt % or more; and an accessory component, $CuBi_2O_4$ and $ZnO-B_2O_3-SiO_2$-based glass of about 20 wt % or less.

The content of $CuBi_2O_4$ may be about 4 wt % to about 10 wt % relative to a total weight of $BaTiO_3$. Also, the content of $ZnO-B_2O_3-SiO_2$-based glass may be about 1 wt % to about 5 wt % relative to the total weight of $BaTiO_3$.

Especially, the content of $CuBi_2O_4$ may be about 6 wt % relative to the total weight of $BaTiO_3$, and the content of $ZnO-B_2O_3-SiO_2$-based glass may be about 4 wt % relative to the total weight of $BaTiO_3$.

The content of ZnO may be about 50 wt % to about 90 wt % relative to a total weight of the glass.

A mean particle diameter of $BaTiO_3$ may be about 500 nm or less.

A sintering temperature may be about 600° C. to about 950° C.

According to another aspect of the present invention, there is provided a multi-layer ceramic capacitor embedded low temperature co-fired ceramic substrate including: a ceramic laminated body laminated with a plurality of ceramic green sheets printed with a ceramic sheet internal electrode; a plurality of dielectric layers formed in the ceramic laminated body, the dielectric layers embedded with a multi-layer ceramic capacitor including a dielectric composition including a main component, $BaTiO_3$ of about 80 wt % and an accessory component, $CuBi_2O_4$ and $ZnO-B_2O_3-SiO_2$ of-based glass of about 20 wt %; and a plurality of capacitor internal electrodes formed between the dielectric layers, and electrically connected to the ceramic sheet internal electrode.

The content of $CuBi_2O_4$ may be about 4 wt % to about 10 wt % relative to a total weight of $BaTiO_3$.

The ceramic sheet internal electrode may include one of Ag and Cu. Also, a firing temperature may be about 600° C. to about 950° C.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
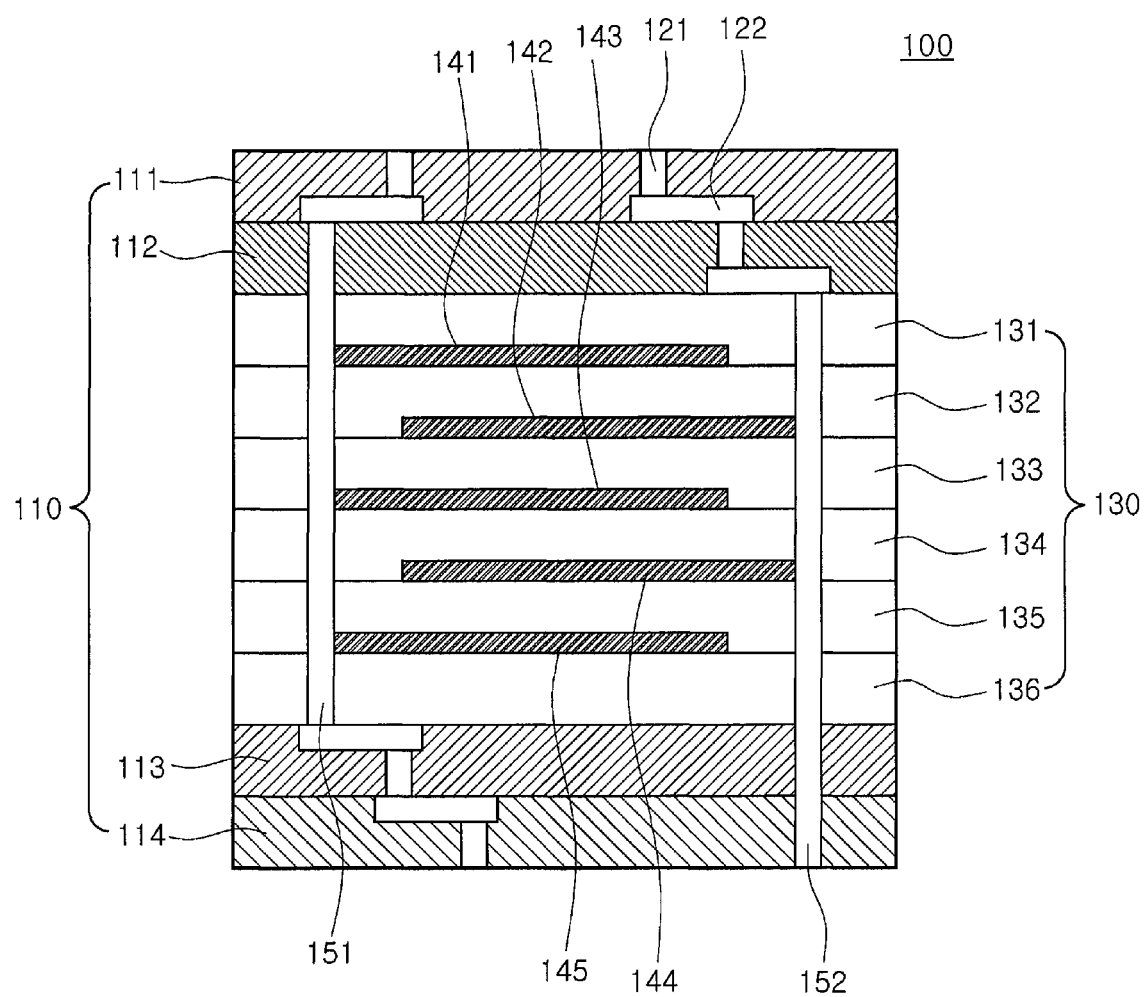
FIG. 1 is a sectional view illustrating a multi-layer ceramic capacitor according to an embodiment of the present invention.

Hereinafter, exemplary embodiments of the present invention will now be described in detail with reference to the accompanying drawings. The exemplary embodiments of the present invention may be modified into various forms. Also, the scope of the present invention should not be construed as limited to the below embodiments. It will be noted that the exemplary embodiments of the present invention are provided for those skilled in the art to more completely understand the present invention. Therefore, the shape and size of elements shown in the drawings may be exaggerated for clarity.

A dielectric composition according to an embodiment of the present invention includes a main component, $BaTiO_3$ of about 80 wt % or more, and an accessory component, $CuBi_2O_4$ and $ZnO$—$B_2O_3$—$SiO_2$-based glass of about 20 wt % or less.

For the dielectric constant of the dielectric composition according to an embodiment of the present invention, $BaTiO_3$ may be used as a ceramic filler. As described above, in order to show a desired level of the dielectric constant, Pb has been generally used as a filler. However, due to an environmental reason of Pb, $BaTiO_3$ instead of Pb is used as a ceramic filler, which is the main component of the composition used in the dielectric layer.

A particle diameter of the filler affects the dielectric constant and the low temperature sintering. If the particle diameter is smaller, the sintering is easier. If the particle diameter is greater, the sintering is more difficult. Accordingly, a mean particle diameter of the main component $BaTiO_3$ is preferably about 500 nm or less.

$BaTiO_3$ may be sintered at a temperature of about 1400° C. or more unless a sintering additive inducing a low temperature firing is used. Moreover, although the sintering additive is used, $BaTiO_3$ is difficult to be sintered at a temperature of about 1000° C. or less. Accordingly, the $CuBi_2O_4$ and $ZnO$—$B_2O_3$—$SiO_2$-based glass are together used in order to form the dielectric composition.

In the dielectric composition, the content increase of the filler is one way of increasing the dielectric constant. However, when the content of the filler is high, there is a limitation in the low temperature sintering. Accordingly, besides $BaTiO_3$, a component capable of reducing the sintering temperature must be included.

According to an embodiment of the present invention, besides the main component $BaTiO_3$, $CuBi_2O_4$ and $ZnO$—$B_2O_3$—$SiO_2$ are used as an accessory component. $CuBi_2O_4$ serves to lower the sintering temperature to a temperature of about 800° C. to about 900° C. $CuBi_2O_4$ is a crystalline ceramic compound formed by mixing CuO and $Bi_2O_3$.

The content of $CuBi_2O_4$ is preferably about 4 wt % to about 10 wt % relative to the total weight of $BaTiO_3$. If the content of $CuBi_2O_4$ is too low, the effect on the sintering temperature of the entire dielectric composition is insignificant. If the content of $CuBi_2O_4$ is too high, the dielectric constant may be lowered.

Besides $CuBi_2O_4$, the $ZnO$—$B_2O_3$—$SiO_2$-based glass may be added as an accessory component. The $ZnO$—$B_2O_3$—$SiO_2$-based glass serves to lower the sintering temperature of the dielectric composition as well as the dielectric loss. The content of the $ZnO$—$B_2O_3$—$SiO_2$-based glass is preferably about 50 wt % to about 90 wt % relative to the total weight of the glass.

If the content of the $ZnO$—$B_2O_3$—$SiO_2$-based glass is too low similarly to $CuBi_2O_4$, the effects on reduction of the sintering temperature and the dielectric loss of the entire composition are too insignificant. If the content of $ZnO$—$B_2O_3$—$SiO_2$ is too high, the dielectric constant maybe lowered. In consideration of this point, the content of $ZnO$—$B_2O_3$—$SiO_2$-based glass is preferably about 1 wt % to 5 wt % relative to the total weight of $BaTiO_3$.

In order to maximally lower the dielectric loss while lowering the sintering temperature to about 950° C. or less, the contents of $CuBi_2O_4$ and the $ZnO$—$B_2O_3$—$SiO_2$-based glass are preferably about 6 wt % and about 4 wt %, respectively.

Although $BaTiO_3$ is used as a main component of the dielectric composition including $BaTiO_3$ as a ceramic filler and $CuBi_2O_4$ and the $ZnO$—$B_2O_3$—$SiO_2$-based glass as an accessory component, the sintering temperature may be about 600° C. to about 950° C. Even in this temperature range, the dielectric composition according to the present invention is sinterable, and shows a relatively high dielectric constant.

In order to manufacture the dielectric composition according to the present invention, first, the main component $BaTiO_3$, and the accessory components $CuBi_2O_4$ and the $ZnO$—$B_2O_3$—$SiO_2$-based glass may be weighed to be a predetermined content, respectively, and manufactured into a slurry form using appropriate additive and solvent. The dielectric slurry is formed into dielectric sheets, which are laminated on each other. This dielectric composition is embedded into a low temperature co-fired ceramic substrate as a multi-layer ceramic capacitor as described below.

According to another embodiment of the present invention, a multi-layer ceramic capacitor embedded low temperature co-fired ceramic substrate is provided. The substrate includes a ceramic laminated body laminated with a plurality of ceramic green sheets printed with a ceramic sheet internal electrode, and a plurality of dielectric layers formed in the ceramic laminated body. The dielectric layer is embedded with a multi-layer ceramic capacitor including a dielectric composition having a main component $BaTiO_3$ of about 80 wt % and accessory components, $CuBi_2O_4$ and $ZnO$—$B_2O_3$—$SiO_2$-based glass of about 20 wt %. The plurality of capacitor internal electrodes are formed between the dielectric layers, and electrically connected to the ceramic sheet internal electrode.

FIG. 1 is a sectional view illustrating a multi-layer ceramic capacitor (MLCC) embedded low temperature co-fired ceramic (LTCC) substrate 100 according to an embodiment of the present invention. Hereinafter, the MLCC embedded LTCC will be described with reference to FIG. 1. However, description of the dielectric composition will be omitted because the dielectric composition has been already described above.

A MLCC embedded LTCC substrate 100 according to the present invention includes a ceramic laminated body 110, ceramic internal electrodes 121 and 122, and a multi-layer ceramic capacitor 130. The ceramic laminated body 110 is laminated with a plurality of ceramic green sheets 111, 112, 113 and 114. The ceramic sheet internal electrodes 121 and 122 are printed in the plurality of ceramic green sheets 111, 112, 113 and 114. The multi-layer ceramic capacitor 130 is embedded into the ceramic laminated body 110.

The ceramic sheet internal electrodes 121 and 122 are electrodes for an electrical connection between the ceramic green sheets 111, 112, 113 and 114, an electrical connection between the ceramic green sheets 111, 112, 113 and 114 and the multi-layer ceramic capacitor 130, and an electrical connection between the MLCC embedded LTCC substrate 100 and an external power source. The MLCC embedded LTCC substrate 100 may be connected to the external power source by forming an external electrode at the ceramic sheet internal electrode 121 exposed to the outside.

Referring to FIG. 1, the ceramic sheet internal electrodes 121 and 122 include a via-typed electrode 121 and a pad-typed electrode 122. The MLCC embedded LTCC substrate 100 includes capacitor external connection electrodes 151 and 152 for connecting capacitor internal electrodes 141, 142, 143, 144 and 145 of the multi-layer ceramic capacitor 130 to the pad-typed ceramic sheet internal electrode 122.

The ceramic sheet internal electrodes 121 and 122, and the capacitor external connection electrodes 151 and 152 may include one of Ag and Cu. Ag or Cu is a metal representing a most excellent performance in the aspect of the electrical conductivity. Accordingly, Ag or Cu may be used as a desirable metallic electrode without any disadvantage while showing an excellent electrical conductivity at a low temperature sintering of about 600° C. to about 950° C.

The ceramic green sheets 111, 112, 113 and 114 include a ceramic filler and a glass component. The ceramic filler usable in the ceramic green sheets 111, 112, 113 and 114 may be a filler sinterable at a low temperature in consideration of the low temperature firing, even if not, may be densified due to a viscous flow caused by the sintering of the glass component. Alumina or Titania may be used as a ceramic filler. The glass may include $B_2O_3$, $SiO_2$, $Al_2O_3$, and CaO.

The ceramic green sheets 111, 112, 113 and 114 is formed into a sheet form by mixing the filler, the glass and a bonding agent for bonding the glass and the filler in the solvent. Besides, additives such as a dispersing agent for the improvement of physical properties may be added to the ceramic green sheets 111, 112, 113 and 114.

The multi-layer ceramic capacitor 130 includes a plurality of dielectric layers 131, 132, 133, 134, 135 and 136, and a plurality of capacitor internal electrodes 141, 142, 143, 144 and 145, which are formed between a plurality of dielectric layers 131, 132, 133, 134, 135 and 136, and electrically connected to the ceramic sheet internal electrodes 121 and 122.

The dielectric layers 131, 132, 133, 134, 135 and 136 may include a main component $BaTiO_3$ of about 80 wt %, and accessory components $CuBi_2O_4$ and $ZnO$—$B_2O_3$—$SiO_2$-based glass of about wt %. The MLCC embedded LTCC substrate 100 sinterable at a low temperature as well as representing the high dielectric constant may be obtained by suppressing the property of $BaTiO_3$ sintered at a high temperature. The firing temperature of the MLCC embedded LTCC substrates 100 according to the present invention may be about 600° C. to about 950° C. like a general low temperature co-fired ceramic substrate.

The capacitor internal electrodes 141, 142, 143, 144 and 145 may include a highly electrically conductive metal, e.g. one of Ag, Cu and Ni.

Embodiment

Hereinafter, the exemplary embodiment of the present invention will be more fully described, but not limited thereto. The firing temperature, the dielectric constant and the dielectric loss (dissipation factor: DF) of the dielectric composition according to the embodiments of the present invention were measured.

First, the firing temperature, the dielectric constant and the dielectric loss of the dielectric composition including only one of $CuBi_2O_4$ and $ZnO$—$B_2O_3$—$SiO_2$ were measured in comparative examples 1 to 5. The result of the measurement is shown in Table 1 below. The measurement was twice performed with respect to the dielectric composition in each comparative example.

TABLE 1

| | $CuBi_2O_4$ (Content) | $ZnO$—$B_2O_3$—$SiO_2$ (Proportion) | $BaTiO_3$ size (nm) | Sintering temperature (° C.) (hour) | Linear shrinkage rate (%) | Dielectric constant | Df (%) |
|---|---|---|---|---|---|---|---|
| Comparative example 1 | $CuBi_2O_4$ 6 wt % | — | 150 150 | 975 925 | 26.7 28.4 | 2617 1205 | 7.50 9.50 |
| Comparative example 2 | $CuBi_2O_4$ 6 wt % | — | 50 50 | 870 (4 hour) | 13.8 13.8 | 506 226 | 275.00 6.80 |
| Comparative example 3 | $CuBi_2O_4$ 6 wt % | — | 50 50 | 910 (4 hour) | 19.1 19.1 | 1066 471 | 90.00 5.90 |
| Comparative example 4 | $CuBi_2O_4$ 10 wt % | — | 150 150 | 890 | 13.8 13.8 | 1294 732 | 63.60 5.90 |
| Comparative example 5 | $CuBi_2O_4$ 10 wt % | — | 150 150 | 925 | 23.8 23.8 | 1914 1303 | 16.70 8.50 |
| Comparative example 6 | — | $ZnO$—$B_2O_3$—$SiO_2$ (7:2:1) 5 wt % | 150 150 | 890 | 10.9 10.9 | 314 291 | 0.77 1.00 |
| Comparative example 7 | — | $ZnO$—$B_2O_3$—$SiO_2$ (7:2:1) 5 wt % | 150 150 | 925 | 17.5 17.5 | 604 550 | 0.83 0.96 |
| Comparative example 8 | — | $ZnO$—$B_2O_3$—$SiO_2$ (6:2:2) 6 wt % | 150 150 | 870 (4 hour) | 17.3 17.3 | 356 178 | 65.70 1.70 |
| Comparative example 9 | — | $ZnO$—$B_2O_3$—$SiO_2$ (6:2:2) 6 wt % | 150 150 | 890 (4 hour) | 18.3 18.3 | 413 260 | 52.60 2.00 |
| Comparative example 10 | — | $ZnO$—$B_2O_3$—$SiO_2$ (6:2:2) 6 wt % | 150 150 | 910 (4 hour) | 20.2 20.2 | 395 308 | 29.00 1.30 |

The firing temperature, the dielectric constant and the dielectric loss of the dielectric composition including both $CuBi_2O_4$ and $ZnO—B_2O_3—SiO_2$ were measured in examples 1 to 32. The result of the measurement is shown in Table 2 below. The measurement was twice performed with respect to the dielectric composition in each example.

Referring to Table 1, in the comparative examples 1 to 5, only was added without to manufacture the dielectric composition. On the other hand, only $ZnO—B_2O_3—SiO_2$ was added without $CuBi_2O_4$ in the comparative examples 6 to 10. In this case, the sintering temperature of the comparative examples was measured to be about 950° C. or less. However,

TABLE 2

| Example | $CuBi_2O_4$ (Content) | $ZnO—B_2O_3—SiO_2$ (Proportion) (Content) | $BaTiO_3$ size (nm) | Sintering Temperature (° C.) (hour) | Linear shrinkage rate (%) | Dielectric constant | Df (%) |
|---|---|---|---|---|---|---|---|
| Example 1 | $CuBi_2O_4$ 6 wt % | $ZnO—B_2O_3—SiO_2$ (7:2:1) 0.5 wt % | 150 150 | 900 (4 hour) | 16.6 16.6 | 1051 906 | 14.60 4.60 |
| Example 2 | $CuBi_2O_4$ 6 wt % | $ZnO—B_2O_3—SiO_2$ (7:2:1) 1 wt % | 150 150 | 900 (4 hour) | 24.2 24.2 | 1346 1167 | 3.40 5.40 |
| Example 3 | $CuBi_2O_4$ 6 wt % | $ZnO—B_2O_3—SiO_2$ (7:2:1) 2 wt % | 150 150 | 900 (4 hour) | 24.2 24.2 | 714 631 | 3.10 3.50 |
| Example 4 | $CuBi_2O_4$ 6 wt % | $ZnO—B_2O_3—SiO_2$ (7:2:1) 2 wt % | 150 150 | 890 | 21.1 21.1 | 1427 954 | 2.90 5.10 |
| Example 5 | $CuBi_2O_4$ 6 wt % | $ZnO—B_2O_3—SiO_2$ (7:2:1) 2 wt % | 150 150 | 925 | 25.0 25.0 | 1523 1309 | 2.80 5.40 |
| Example 6 | $CuBi_2O_4$ 6 wt % | $ZnO—B_2O_3—SiO_2$ (7:2:1) 4 wt % | 150 150 | 890 | 23.8 23.8 | 1112 951 | 8.00 2.90 |
| Example 7 | $CuBi_2O_4$ 6 wt % | $ZnO—B_2O_3—SiO_2$ (7:2:1) 4 wt % | 150 150 | 925 | 25.0 25.0 | 609 558 | 1.80 2.85 |
| Example 8 | $CuBi_2O_4$ 6 wt % | $ZnO—B_2O_3—SiO_2$ (7:2:1) 6 wt % | 150 150 | 890 | 19.2 19.2 | 1106 897 | 21.30 2.50 |
| Example 9 | $CuBi_2O_4$ 6 wt % | $ZnO—B_2O_3—SiO_2$ (7:2:1) 6 wt % | 150 150 | 925 | 24.9 24.9 | 889 702 | 11.00 4.00 |
| Example 10 | $CuBi_2O_4$ 6 wt % | $ZnO—B_2O_3—SiO_2$ (7:2:1) 8 wt % | 150 150 | 890 | 22.1 22.1 | 854 690 | 15.50 2.50 |
| Example 11 | $CuBi_2O_4$ 6 wt % | $ZnO—B_2O_3—SiO_2$ (7:2:1) 8 wt % | 150 150 | 900 | 24.2 24.2 | 514 466 | 3.00 2.60 |
| Example 12 | $(CuBi_2O_4 + Bi_2O_3\ 1:1)$ 6 wt % | $ZnO—B_2O_3—SiO_2$ (7:2:1) 4 wt % | 150 150 | 890 | 15.1 15.1 | 576 517 | 9.10 1.90 |
| Example 13 | $(CuBi_2O_4 + Bi_2O_3\ 1:1)$ 6 wt % | $ZnO—B_2O_3—SiO_2$ (7:2:1) 4 wt % | 150 150 | 900 | 19.2 19.2 | 894 793 | 7.10 2.60 |
| Example 14 | $(CuBi_2O_4 + Bi_2O_3\ 1:1)$ 6 wt % | $ZnO—B_2O_3—SiO_2$ (7:2:1) 6 wt % | 150 150 | 890 | 18.1 18.1 | 734 629 | 15.20 1.90 |
| Example 15 | $(CuBi_2O_4 + Bi_2O_3\ 1:1)$ 6 wt % | $ZnO—B_2O_3—SiO_2$ (7:2:1) 6 wt % | 150 150 | 900 | 21.2 21.2 | 813 707 | 10.40 2.50 |
| Example 16 | $CuBi_2O_4$ 6 wt % | $ZnO—B_2O_3—SiO_2$ (7:2:1) 2 wt % | 50 50 | 870 (4 hour) | 22.9 22.9 | 954 564 | 35.00 5.10 |
| Example 17 | $CuBi_2O_4$ 6 wt % | $ZnO—B_2O_3—SiO_2$ (7:2:1) 2 wt % | 50 50 | 890 (4 hour) | 23.3 23.3 | 844 583 | 22.00 4.70 |
| Example 18 | $CuBi_2O_4$ 6 wt % | $ZnO—B_2O_3—SiO_2$ (7:2:1) 2 wt % | 50 50 | 910 (4 hour) | 24.7 24.7 | 718 579 | 7.80 4.50 |
| Example 19 | $CuBi_2O_4$ 6 wt % | $ZnO—B_2O_3—SiO_2$ (7:2:1) 4 wt % | 50 50 | 870 (4 hour) | 21.4 21.4 | 545 425 | 14.00 4.00 |
| Example 20 | $CuBi_2O_4$ 6 wt % | $ZnO—B_2O_3—SiO_2$ (7:2:1) 4 wt % | 50 50 | 890 (4 hour) | 22.8 22.8 | 513 426 | 7.60 4.00 |
| Example 21 | $CuBi_2O_4$ 6 wt % | $ZnO—B_2O_3—SiO_2$ (7:2:1) 4 wt % | 50 50 | 910 (4 hour) | 24.1 24.1 | 532 439 | 8.00 4.00 |
| Example 22 | $CuBi_2O_4$ 6 wt % | $ZnO—B_2O_3—SiO_2$ (7:2:1) 6 wt % | 50 50 | 890 (4 hour) | 17.7 17.7 | 853 363 | 137.00 6.30 |
| Example 23 | $CuBi_2O_4$ 6 wt % | $ZnO—B_2O_3—SiO_2$ (6:2:2) 2 wt % | 150 150 | 870 (4 hour) | 20.8 20.8 | 1091 487 | 80.00 5.70 |
| Example 24 | $CuBi_2O_4$ 6 wt % | $ZnO—B_2O_3—SiO_2$ (6:2:2) 2 wt % | 150 150 | 890 (4 hour) | 23.0 23.0 | 875 472 | 57.60 3.90 |
| Example 25 | $CuBi_2O_4$ 6 wt % | $ZnO—B_2O_3—SiO_2$ (6:2:2) 2 wt % | 150 150 | 910 (4 hour) | 24.7 24.7 | 708 509 | 26.00 3.20 |
| Example 26 | $CuBi_2O_4$ 6 wt % | $ZnO—B_2O_3—SiO_2$ (6:2:2) 4 wt % | 150 150 | 870 (4 hour) | 22.4 22.4 | 630 451 | 29.50 4.50 |
| Example 27 | $CuBi_2O_4$ 6 wt % | $ZnO—B_2O_3—SiO_2$ (6:2:2) 4 wt % | 150 150 | 890 (4 hour) | 23.2 23.2 | 638 494 | 19.70 4.10 |
| Example 28 | $CuBi_2O_4$ 6 wt % | $ZnO—B_2O_3—SiO_2$ (6:2:2) 4 wt % | 150 150 | 910 (4 hour) | 23.8 23.8 | 649 535 | 13.80 3.80 |
| Example 29 | $CuBi_2O_4$ 4 wt % | $ZnO—B_2O_3—SiO_2$ (7:2:1) 2 wt % | 100 100 | 890 | 22.3 22.3 | 792 682 | 3.80 4.60 |
| Example 30 | $CuBi_2O_4$ 4 wt % | $ZnO—B_2O_3—SiO_2$ (7:2:1) 2 wt % | 100 100 | 910 | 23.5 23.5 | 766 672 | 2.30 4.20 |
| Example 31 | $CuBi_2O_4$ 6 wt % | $ZnO—B_2O_3—SiO_2$ (7:2:1) 2 wt % | 100 100 | 890 | 22.6 22.6 | 748 623 | 4.80 4.30 |
| Example 32 | $CuBi_2O_4$ 6 wt % | $ZnO—B_2O_3—SiO_2$ (7:2:1) 2 wt % | 100 100 | 910 | 23.5 23.5 | 684 580 | 3.70 4.20 | in these comparative examples, the dielectric constant was measured to be about 500 or less, or the dielectric loss was measured to be about 10% or more. Accordingly, the dielectric constant was shown not to be good when only one additive was used.

On the other hand, both $CuBi_2O_4$ and $ZnO$—$B_2O_3$—$SiO_2$ were used in the examples 1 to 32. As described in table 2, the sintering temperature was measured to be a relatively low temperature of about 950° C. or less. Also, the dielectric constant was about 500 or more. The dielectric loss was about 10 % on average. A dielectric composition having an excellent property capable of increasing the dielectric constant and reducing the dielectric loss while lowering the sintering temperature of the dielectric composition was found to be manufactured when both additives were used.

Figure 2:
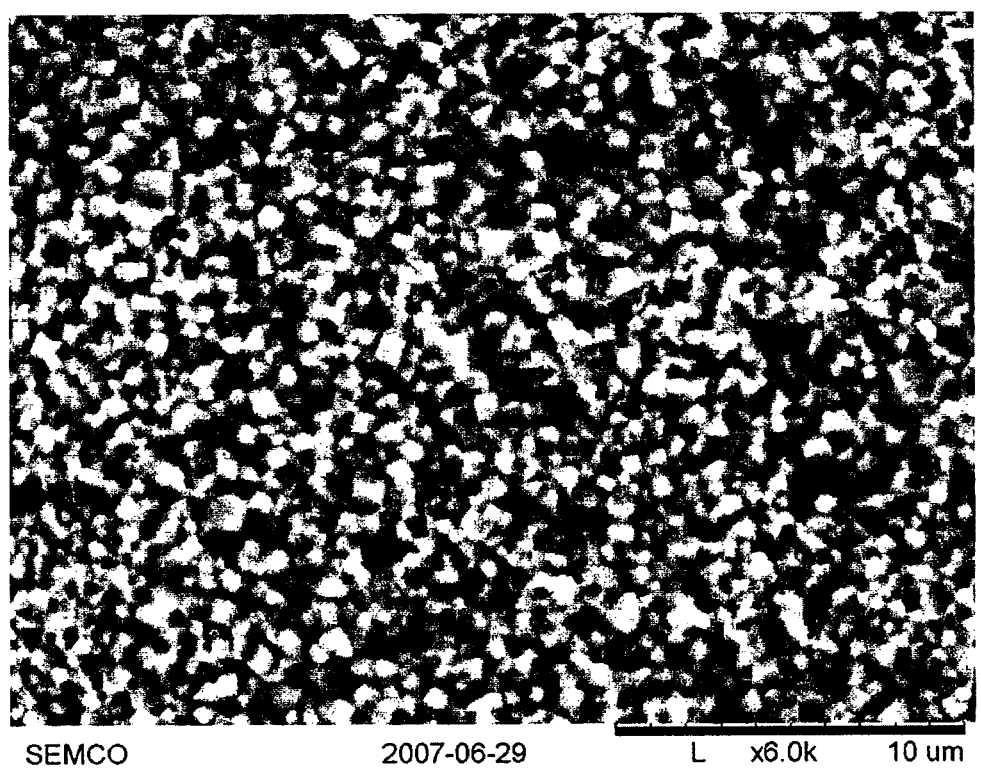
FIG. 2 is a scanning electron micrograph illustrating a sintered dielectric composition according to an embodiment of the present invention.

FIG. 2 is a scanning electron micrograph illustrating a sintered dielectric composition according to an embodiment of the present invention. In order to manufacture the dielectric composition, $CuBi_2O_4$ and $ZnO$—$B_2O_3$—$SiO_3$ are added to $BaTiO_3$ powder so as to be about 6 wt % and about 4 wt %, respectively. There is a micro structure generated by a sintering at a temperature of about 925° C. It was verified that a densification occurred together with a change of a particle shape. Accordingly, the dielectric composition according to the present invention was found to be sinterable at a low temperature of about 950° C. or less.

The dielectric composition according to the embodiments of the present invention can be sintered at a temperature of about 1,100° C. or less. Moreover, the dielectric having an excellent high temperature insulation resistance as well as satisfying X5R characteristics can be obtained.

If the multi-layer ceramic capacitor is manufactured using the dielectric composition, the $BaTiO_3$ dielectric layer can be uniformly sintered. As a result, a conglomeration of the internal electrodes can be suppressed by reducing a sintering shrinkage difference between the internal electrode and the dielectric layer. Accordingly, the short circuit rate can be minimized. At the same time, the electrostatic capacity can be maximized.

In addition, due to the improvement of the electrical properties and high-temperature insulation resistance, it is possible to manufacture a multi-layer ceramic capacitor having high reliability capable of satisfying X5R characteristics.

While the present invention has been shown and described in connection with the exemplary embodiments, it will be apparent to those skilled in the art that modifications and variations can be made without departing from the spirit and scope of the invention as defined by the appended claims.

What is claimed is:

1. A dielectric composition comprising:
    a main component, $BaTiO_3$ of about 80 wt % or more; and
    an accessory component, $CuBi_2O_4$ and $ZnO$—$B_2O_3$—$SiO_2$-based glass of about 20 wt % or less.

2. The dielectric composition of claim 1, wherein the content of $CuBi_2O_4$ is about 4 wt % to about 10 wt % relative to the total weight of $BaTiO_3$.

3. The dielectric composition of claim 1, wherein the content of $ZnO$—$B_2O_3$—$SiO_2$-based glass is about 1 wt % to about 5 wt % relative to the total weight of $BaTiO_3$.

4. The dielectric composition of claim 1, wherein the content of $CuBi_2O_4$ is about 6 wt % relative to a total weight of $BaTiO_3$, and the content of $ZnO$—$B_2O_3$—$SiO_2$-based glass is about 4 wt % relative to the total weight of $BaTiO_3$.

5. The dielectric composition of claim 1, wherein the content of $ZnO$ is about 50 wt % to about 90 wt % relative to the total weight of the glass.

6. The dielectric composition of claim 1, wherein the mean particle diameter of $BaTiO_3$ is about 500 nm or less.

7. The dielectric composition of claim 1, wherein a sintering temperature is about 600° C. to about 950° C.

8. A multi-layer ceramic capacitor embedded low temperature co-fired ceramic substrate comprising:
    a ceramic laminated body laminated with a plurality of ceramic green sheets printed with a ceramic sheet internal electrode;
    a plurality of dielectric layers formed in the ceramic laminated body, the dielectric layers embedded with a multi-layer ceramic capacitor comprising a dielectric composition comprising a main component, $BaTiO_3$ of about 80 wt % or more and an accessory component, $CuBi_2O_4$ and $ZnO$—$B_2O_3$—$SiO_2$-based glass of about 20 wt % or less; and
    a plurality of capacitor internal electrodes formed between the dielectric layers, and electrically connected to the ceramic sheet internal electrode.

9. The multi-layer ceramic capacitor embedded low temperature co-fired ceramic substrate of claim 8, wherein the content of $CuBi_2O_4$ is about 4 wt % to about 10 wt % relative to the total weight of $BaTiO_3$.

10. The multi-layer ceramic capacitor embedded low temperature co-fired ceramic substrate of claim 8, wherein the content of $ZnO$—$B_2O_3$—$SiO_2$-based glass is about 1 wt % to about 5 wt % relative to the total weight of $BaTiO_3$.

11. The multi-layer ceramic capacitor embedded low temperature co-fired ceramic substrate of claim 8, wherein the ceramic sheet internal electrode comprises one of Ag and Cu.

12. The multi-layer ceramic capacitor embedded low temperature co-fired ceramic substrate of claim 8, wherein a firing temperature is about 600° C. to about 950° C.

* * * * *